United States Patent
Tsuji (10) Patent No.: US 8,357,555 B2
(45) Date of Patent: Jan. 22, 2013

(54) METHOD FOR PRODUCING SEMICONDUCTOR OPTICAL DEVICE

(75) Inventor: Yukihiro Tsuji, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 71 days.

(21) Appl. No.: 13/151,619

(22) Filed: Jun. 2, 2011

(65) Prior Publication Data

US 2011/0306155 A1    Dec. 15, 2011

(30) Foreign Application Priority Data

Jun. 9, 2010    (JP) ................. 2010-132258

(51) Int. Cl.
*H01L 21/00*    (2006.01)
*H01L 33/58*    (2010.01)

(52) U.S. Cl. ............... 438/32; 438/706; 257/E33.068

(58) Field of Classification Search .......... 438/32, 438/706; 257/E33.068
See application file for complete search history.

(56) References Cited

U.S. PATENT DOCUMENTS

| | | | |
|---|---|---|---|
| 4,986,877 A * | 1/1991 | Tachi et al. | 438/713 |
| 5,707,487 A * | 1/1998 | Hori et al. | 438/703 |
| 7,456,039 B1 * | 11/2008 | Kawasaki et al. | 438/31 |
| 7,879,719 B2 * | 2/2011 | Jeong | 438/638 |
| 7,977,129 B2 * | 7/2011 | Tsuji | 438/32 |
| 2002/0187579 A1 * | 12/2002 | Kubota | 438/43 |
| 2005/0069732 A1 * | 3/2005 | Kamata et al. | 428/694 TC |
| 2008/0020502 A1 * | 1/2008 | Shiga et al. | 438/31 |
| 2008/0090315 A1 * | 4/2008 | Abe et al. | 438/31 |
| 2009/0227055 A1 * | 9/2009 | Kusunoki et al. | 438/31 |
| 2010/0094415 A1 * | 4/2010 | Bumbalough | 623/6.51 |
| 2012/0058582 A1 * | 3/2012 | Tsuji | 438/32 |

FOREIGN PATENT DOCUMENTS

JP    2008-300737    12/2008

* cited by examiner

*Primary Examiner* — Alexander Ghyka
*Assistant Examiner* — Stanetta Isaac
(74) *Attorney, Agent, or Firm* — Smith, Gambrell & Russell, LLP (57) ABSTRACT

A method for producing a semiconductor optical device includes the steps of forming a semiconductor layer; forming a non-silicon-containing resin layer; forming a first pattern in the non-silicon-containing resin layer; forming a silicon-containing resin layer; etching the silicon-containing resin layer to have a second pattern reverse to the first pattern; selectively etching the non-silicon-containing resin layer by a RIE method employing a gas mixture containing $CF_4$ gas and $O_2$ gas, the non-silicon-containing resin layer having the second pattern; and etching the semiconductor layer. In the step of selectively etching the non-silicon-containing resin layer, a side wall of the second pattern in the silicon-containing resin layer and the non-silicon-containing resin layer is formed, the silicon-containing resin layer and the non-silicon-containing resin layer are maintained at a temperature equal to or less than a freezing point of $SiF_4$, and a protective layer containing $SiF_4$ is formed on the side wall of the second pattern.

8 Claims, 10 Drawing Sheets

METHOD FOR PRODUCING SEMICONDUCTOR OPTICAL DEVICE

BACKGROUND OF THE INVENTION

1. Field of the Invention

The present invention relates to a method for producing a semiconductor optical device, in particular, to a method for producing a semiconductor optical device including a diffraction grating.

2. Description of the Related Art

Patent Document 1 (Japanese Unexamined Patent Application Publication No. 2008-300737) describes a method for producing a semiconductor device including a diffraction grating. This method includes a step of forming a mask by drawing a pattern for the formation of the diffraction grating. In this step of forming a mask, sections of the pattern constituting a periodic structure are drawn such that the width of their ends in the longitudinal direction is larger than the width of their central portions in the longitudinal direction. As a result, the diffraction grating can be made to have a uniform depth in the entire structure.

SUMMARY OF THE INVENTION

A diffraction grating formed in a distributed feedback laser diode (DFB laser diode) has periodic projections and recesses having a period of about 200 nm. The height between the projections and recesses of such a diffraction grating is about 50 to 300 nm. In the production of semiconductor devices having such micropatterns, the micropatterns need to be formed with high accuracy and high reproducibility. Such a diffraction grating is formed by, for example, a two-beam interference exposure technique or an electron beam (EB) exposure technique. In such a technique, a diffraction-grating pattern is formed in a resist monolayer (resin layer) formed on a semiconductor layer. The semiconductor layer is then etched through the pattern in the resist monolayer serving as a mask to thereby transfer the pattern to the semiconductor layer.

Compound semiconductor substrates used for producing semiconductor devices do not have completely flat surfaces and the surfaces may have irregularities (surface roughness) of about 0.1 μm (100 nm). When a semiconductor layer formed on such a compound semiconductor substrate having irregularities is patterned through a resist monolayer so as to have a micropattern for a diffraction grating or the like, variation in the structure of the micropattern (for example, the width of sections of a diffraction-grating pattern) may occur due to irregularities of the substrate. To reduce such variation in the structure of a micropattern, a laminated resin film (bilayer resist) constituted by a non-silicon-containing resin layer (non-silicon-containing resist layer) and a silicon-containing resin layer (silicon-containing resist layer) can be employed.

A method for forming a diffraction grating will be described as an example of forming a micropattern by using such a laminated resin film (bilayer resist).

An insulation layer and a non-silicon-containing resin layer are formed in this order on a semiconductor layer that is to be patterned so as to have a micropattern. At this time, the non-silicon-containing resin layer is formed so as to have a thickness sufficiently large to completely fill and cover irregularities in a surface of the semiconductor substrate. Thus, the non-silicon-containing resin layer covers the irregularities of the semiconductor substrate and has a flat surface. A diffraction-grating pattern (line-and-space pattern) is formed in the flat surface of the non-silicon-containing resin layer by a nano-imprint technique or the like.

A silicon-containing resist layer is then formed on the non-silicon-containing resist layer having the diffraction-grating pattern so as to completely cover the diffraction-grating pattern. Then, the silicon-containing resist layer is selectively etched by a reactive ion etching method until the top surface of the line-and-space pattern of the non-silicon-containing resist layer is exposed (etch-back step). The non-silicon-containing resin layer is then selectively etched through the silicon-containing resist layer formed in recesses of the diffraction-grating pattern by a reactive ion etching method until portions of the surface of the insulation layer is exposed (breakthrough etching step). As a result, a pattern in which projections and recesses are inverted with respect to the diffraction-grating pattern originally formed in the non-silicon-containing resin layer is formed. The insulation layer is then etched through the patterned non-silicon-containing resist layer and the patterned silicon-containing resist layer by a reactive ion etching method. The non-silicon-containing resist layer and the silicon-containing resist layer are then removed. The semiconductor layer is etched through the patterned insulation layer to form the diffraction grating in the semiconductor layer. The diffraction-grating pattern (inverted pattern) originally formed in the non-silicon-containing resin layer is accurately transferred to the semiconductor layer.

In summary, by forming a diffraction-grating pattern with a bilayer resin film (serving as a mask) having a non-silicon-containing resin layer and a silicon-containing resin layer, variation in the structure of the diffraction-grating pattern due to irregularities in a surface of the semiconductor substrate can be reduced.

Since the material selectively etched in the etch-back step is different from the material selectively etched in the breakthrough etching step, different etching gases need to be used in the etch-back step and in the breakthrough etching step. Accordingly, the etch-back step and the breakthrough etching step need to be performed by, (1) the etching gas having been used in the etch-back step is exhausted over a long time from the chamber of the reactive ion etching apparatus and then the breakthrough etching step is performed, or (2) the etch-back step and the breakthrough etching step are performed with different reactive ion etching apparatuses. Thus, existing methods for producing diffraction gratings by using a bilayer resist are performed with a low productivity.

In addition, in a conventional reactive ion etching method, a layer is isotropically etched. Accordingly, side etching in the non-silicon-containing resist layer is occurred in the breakthrough etching step. Then, the width of line sections in the non-silicon-containing resist layer is decreased by side etching. Such a decrease in the width of line sections causes variation in the structure of a diffraction grating formed in the semiconductor layer.

A method for producing a semiconductor optical device according to an aspect of the present invention includes the steps of forming a semiconductor layer on a substrate; forming a non-silicon-containing resin layer on the semiconductor layer; forming a first pattern having a projection and a recess in the non-silicon-containing resin layer; forming a silicon-containing resin layer on the non-silicon-containing resin layer so as to cover the projection and the recess; etching the silicon-containing resin layer until a surface of the projection of the non-silicon-containing resin layer is exposed, the silicon-containing resin layer being left in the recess of the non-silicon-containing resin layer, the silicon-containing resin layer having a second pattern reverse to the first pattern;

selectively etching the non-silicon-containing resin layer through the patterned silicon-containing resin layer by a reactive ion etching method employing a gas mixture containing $CF_4$ gas and $O_2$ gas, the non-silicon-containing resin layer having the second pattern; and etching the semiconductor layer through the patterned non-silicon-containing resin layer. In addition, in the step of selectively etching the non-silicon-containing resin layer, a side wall of the second pattern in the silicon-containing resin layer and the non-silicon-containing resin layer is formed, the silicon-containing resin layer and the non-silicon-containing resin layer are maintained at a temperature equal to or less than a freezing point of $SiF_4$, and a protective layer containing $SiF_4$ is formed on the side wall of the second pattern in the silicon-containing resin layer and the non-silicon-containing resin layer.

The above-described method for producing a semiconductor optical device includes the steps of forming a first pattern having a projection and a recess in the non-silicon-containing resin layer, forming a silicon-containing resin layer on the non-silicon-containing resin layer, and etching the silicon-containing resin layer until a surface of the projection of the non-silicon-containing resin layer is exposed. Then, the silicon-containing resin layer is left in the recess of the non-silicon-containing resin layer. The first pattern in the non-silicon-containing resin layer is transferred to the silicon-containing resin layer, and the silicon-containing resin layer left in the recess of the non-silicon-containing resin layer has a second pattern reverse to the first pattern. Furthermore, the method for producing a semiconductor optical device includes a step of selectively etching the non-silicon-containing resin layer through the patterned silicon-containing resin layer while the silicon-containing resin layer and the non-silicon-containing resin layer are maintained at a temperature equal to or less than a freezing point of $SiF_4$. The non-silicon-containing resin layer also has the second pattern by etching through the patterned silicon-containing resin layer. In addition, in the step of selectively etching the non-silicon-containing resin layer, a side wall of the second pattern in the silicon-containing resin layer and the non-silicon-containing resin layer is formed, and a protective layer containing frozen $SiF_4$ is formed on the side wall of the second pattern in the silicon-containing resin layer and the non-silicon-containing resin layer. In the step of selectively etching the non-silicon-containing resin layer, side etching of the patterned silicon-containing resin layer and the patterned non-silicon-containing resin layer is suppressed because of forming the protective layers on the side wall of the second pattern in the silicon-containing resin layer and the non-silicon-containing resin layer. As a result, variation in the structure of the pattern in the non-silicon-containing resin layer due to side etching is suppressed. Thus, variation in the structure of the pattern formed in the semiconductor layer in accordance with the transferred pattern in the non-silicon-containing resin layer is also suppressed. Therefore, the first pattern having a projection and a recess in the non-silicon-containing resin layer can be transferred to the semiconductor layer with high accuracy and high reproducibility.

The above-described method for producing a semiconductor optical device preferably further includes, after the step of selectively etching the non-silicon-containing resin layer, a step of increasing a temperature of the silicon-containing resin layer and the non-silicon-containing resin layer to a temperature higher than the freezing point of $SiF_4$.

In this case, the protective layers formed on the side wall of the silicon-containing resin layer and on the side wall of the non-silicon-containing resin layer are vaporized and removed. Accordingly, the protective layers do not affect the structure of the pattern formed in the subsequent step of etching the semiconductor layer.

In the above-described method for producing a semiconductor optical device, in the step of etching the silicon-containing resin layer, the silicon-containing resin layer is preferably etched by a reactive ion etching method employing a gas mixture containing $CF_4$ gas and $O_2$ gas while the silicon-containing resin layer and the non-silicon-containing resin layer are maintained at a temperature equal to or less than the freezing point of $SiF_4$.

In this case, in the step of etching the silicon-containing resin layer and the subsequent step of selectively etching the non-silicon-containing resin layer, the silicon-containing resin layer and the non-silicon-containing resin layer are maintained at a temperature equal to or less than the freezing point of $SiF_4$. Thus, the step of etching the silicon-containing resin layer and the step of selectively etching the non-silicon-containing resin layer can be continuously performed. In addition, as described above, side etching in the side surfaces of the silicon-containing resin layer and the side surfaces of the non-silicon-containing resin layer is suppressed due to the protective layers in the step of selectively etching the non-silicon-containing resin layer. Thus, in the steps of etching the silicon-containing resin layer and selectively etching the non-silicon-containing resin layer, a reactive ion etching method can be performed with a gas mixture containing $CF_4$ gas and $O_2$ gas to etch the silicon-containing resin layer and the non-silicon-containing resin layer. Accordingly, the etching gas does not need to be exhausted from the chamber of a reactive ion etching apparatus after the first etching step. Furthermore, the same reactive ion etching apparatus can be used in the steps of etching the silicon-containing resin layer and selectively etching the non-silicon-containing resin layer.

The above-described method for producing a semiconductor optical device may further include the steps of forming an insulation layer on the semiconductor layer after the step of forming the semiconductor layer; and etching the insulation layer through the patterned non-silicon-containing resin layer to form a patterned insulation layer having the second pattern after the step of selectively etching the non-silicon-containing resin layer. Furthermore, in the step of selectively etching the non-silicon-containing resin layer, the non-silicon-containing resin layer is etched until a portion of a surface of the insulation layer is exposed, in the step of etching the insulation layer, the insulation layer is etched until a portion of a surface of the semiconductor layer is exposed, and in the step of etching the semiconductor layer, the semiconductor layer is etched through the patterned insulation layer. Since the insulation layer is formed on the semiconductor layer and the pattern is transferred to the insulation layer, the semiconductor layer can be etched through the patterned insulation layer serving as a mask. Since the insulation layer is formed on the semiconductor layer, contamination of the surface of the semiconductor layer can be suppressed during forming a micropattern with the laminated resin film of the non-silicon-containing resin layer and the silicon-containing resin layer. In addition, the surface of the semiconductor layer can be protected from damage caused by reactive ion etching.

In the above-described method for producing a semiconductor optical device, in the step of etching the insulation layer, the insulation layer is preferably etched by a reactive ion etching method employing a gas mixture containing $CF_4$ gas and $O_2$ gas while the silicon-containing resin layer, the non-silicon-containing resin layer, and the insulation layer are maintained at a temperature equal to or less than the freezing point of $SiF_4$; and in the step of etching the insulation layer, a protective layer containing $SiF_4$ is formed on a side wall of the second pattern of the insulation layer.

In this case, the above-described method for producing a semiconductor optical device may further include, after the step of etching the insulation layer, a step of increasing a temperature of the silicon-containing resin layer, the non-silicon-containing resin layer, and the insulation layer to a temperature higher than the freezing point of $SiF_4$.

In the above-described case, the silicon-containing resin layer and the non-silicon-containing resin layer have the protective layer on their side walls in the step of etching the insulation layer. In addition, the protective layer containing $SiF_4$ can also be formed on a side wall of the second pattern of the insulation layer. Thus, in the step of etching the insulation layer, side etching of the insulation layer is suppressed. As a result, variation in the structure of the pattern in the insulation layer due to side etching is suppressed. Accordingly, when the semiconductor layer is etched through the patterned insulation layer serving as a mask, variation in the structure of the pattern in the semiconductor layer is also suppressed.

In the above-described method for producing a semiconductor optical device, the first pattern may be a diffraction grating pattern having periodic projections and recesses.

In the above-described method for producing a semiconductor optical device, in the step of selectively etching the non-silicon-containing resin layer, the non-silicon-containing resin layer is etched by inductive coupled plasma reactive ion etching at a bias power between 50 W and 100 W. When the non-silicon-containing resin layer is etched by inductive coupled plasma reactive ion etching at a bias power of 50 W or more, the formation of the protective layer having excessively large thickness is suppressed on the side wall of the silicon-containing resin layer and on the side wall of the non-silicon-containing resin layer. In addition, the non-silicon-containing resin layer may be etched without hampering of etching due to the large thickness of the protective layers. When the non-silicon-containing resin layer is etched by inductive coupled plasma reactive ion etching at a bias power of 100 W or less, the protective layer having a thickness to suppress side etching of the silicon-containing resin layer and the non-silicon-containing resin layer can be formed.

DESCRIPTION OF THE PREFERRED EMBODIMENTS

Hereinafter, a method for producing a semiconductor optical device according to embodiments will be described in detail with reference to the attached drawings. Like reference numerals are used to designate the same elements throughout the drawings. To make the drawings more readily understandable, dimensional proportions within elements and between elements are not necessarily based on the actual dimensional proportions.

As a method for producing a semiconductor optical device according to an embodiment, a method for producing a distributed feedback laser diode (DFB laser diode) including a diffraction grating will be described. FIGS. 1A to 3B and FIGS. 5A to 10C are schematic sectional views illustrating a method for producing a DFB laser diode according to an embodiment. An orthogonal coordinate system 10 is illustrated in FIGS. 1A to 3B and FIGS. 5A to 10C. A diffraction grating formed in a DFB laser diode has periodic projections and recesses. The diffraction grating has a period of, for example, 200 nm. And the height between the projection and the recess is about 50 to 300 nm, for example.

Step of Forming Semiconductor Layer

Figure 1A:
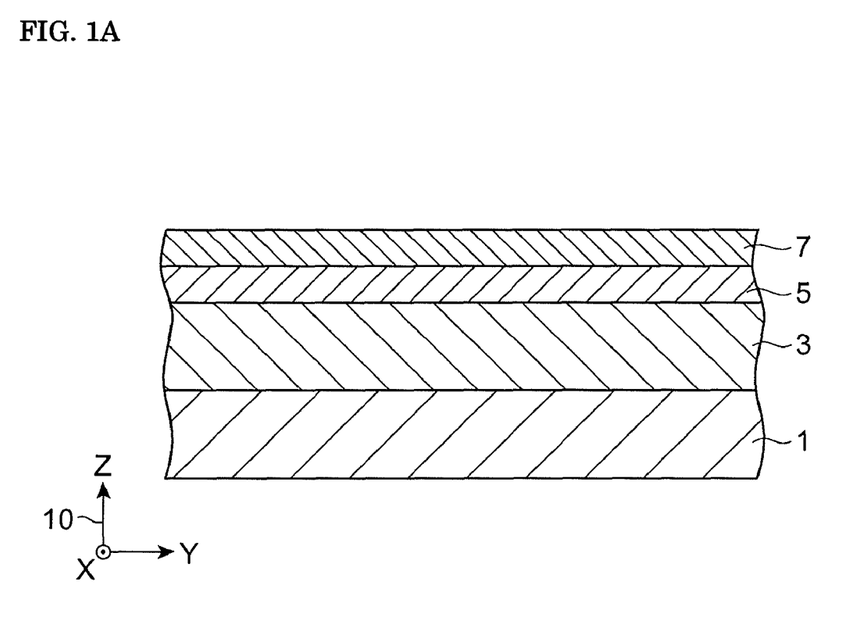
FIGS. 1A and 1B are schematic sectional views illustrating a method for producing a distributed feedback laser diode according to an embodiment.

Referring to FIG. 1A, a lower cladding layer 3, an active layer 5, and a diffraction-grating layer 7 are grown in this order on a main surface of a semiconductor substrate 1 by, for example, a metal-organic vapor phase epitaxy (MOVPE) growth method. In FIG. 1A, X and Y axes are defined in directions parallel to the main surfaces of the semiconductor substrate 1.

The semiconductor substrate 1 is a group III-V compound semiconductor substrate having a first conductivity. For example, the semiconductor substrate 1 is an n-type InP substrate doped with Sn (tin). The lower cladding layer 3 is a group III-V compound semiconductor layer having the first conductivity, for example, an n-type InP layer doped with Si. The active layer 5 has, for example, a multi quantum well (MQW) structure or a single quantum well (SQW) structure. The active layer 5 is composed of, for example, a group III-V compound semiconductor such as GaInAsP or AlGaInAs. The diffraction-grating layer 7 is a group III-V compound semiconductor layer having a second conductivity in which a diffraction grating 7g is to be formed (refer to FIG. 8A). The diffraction-grating layer 7 is, for example, a p-type GaInAsP layer doped with Zn.

Step of Forming Insulation Layer

Figure 1B:
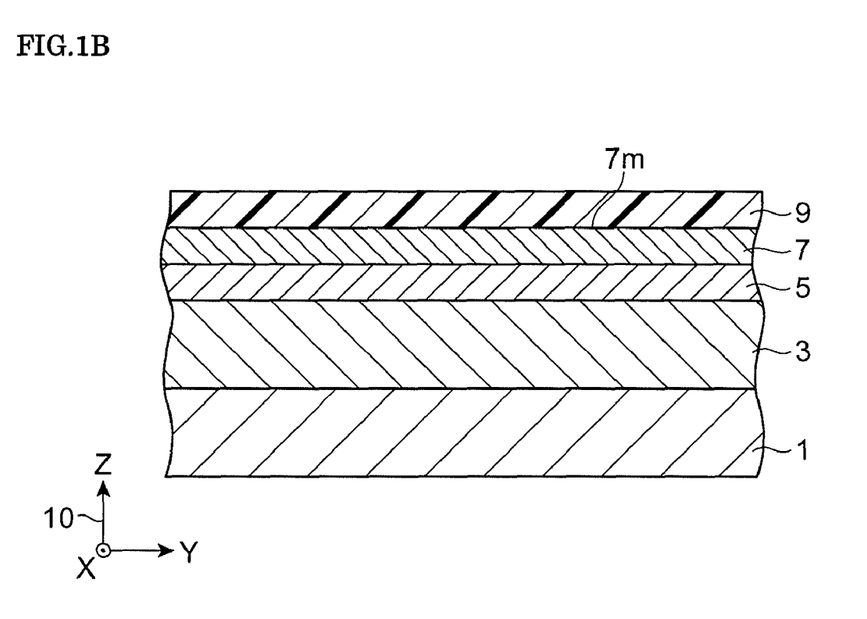

Referring to FIG. 1B, an insulation layer 9 is then formed on a surface 7m of the diffraction-grating layer 7 by, for example, plasma chemical vapor deposition (plasma CVD). The insulation layer 9 has a thickness of, for example, 20 to 50 nm. The insulation layer 9 is made of, for example, silicon oxide such as $SiO_2$, silicon nitride such as SiN, or silicon oxynitride such as SiON.

Step of Forming Non-Silicon-Containing Resin Layer

Figure 2A:
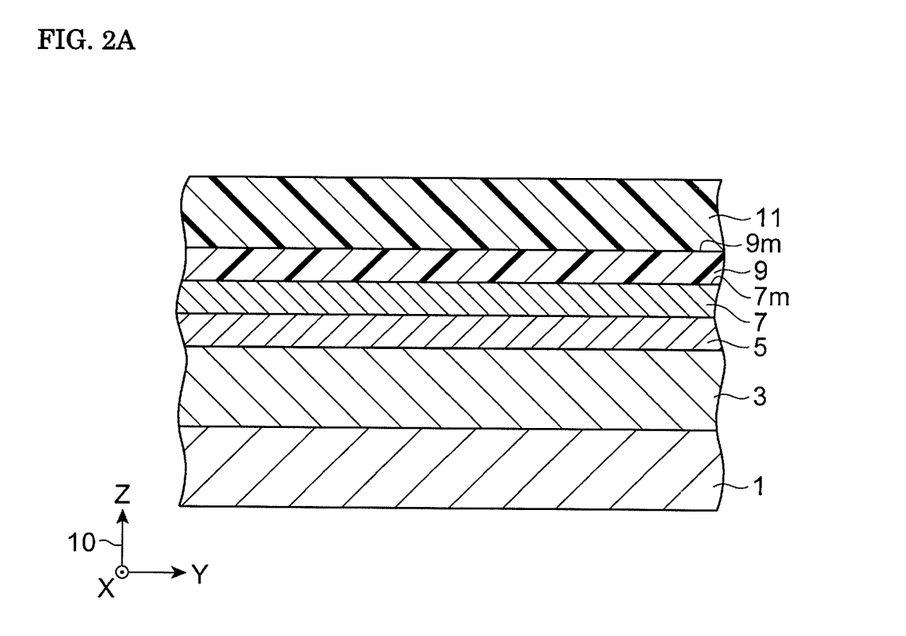
FIGS. 2A and 2B are schematic sectional views illustrating a method for producing a distributed feedback laser diode according to an embodiment.

Referring to FIG. 2A, a non-silicon-containing resin layer 11 is subsequently formed on a surface 9m of the insulation layer 9. The non-silicon-containing resin layer 11 is composed of a resin that substantially contains no silicon. The non-silicon-containing resin layer 11 is formed on a surface 9m of the insulating film 9 by using, for example, a spin coating method. Thus, the non-silicon-containing resin layer 11 that has a small and uniform thickness can be obtained. A non-silicon-containing resin is for example, a ultraviolet (UV) curing resin such as UV-curing acrylic resin that substantially contains no silicon. When the non-silicon-containing resin layer 11 has a silicon content of 0.1 atom % or less, the non-silicon-containing resin layer 11 can be regarded as substantially containing no silicon.

The non-silicon-containing resin layer 11 is preferably made to have a thickness sufficiently large to completely fill and cover irregularities in the surface 9m of the insulation layer 9 due to irregularities in a main surface of the semiconductor substrate 1. That is, the non-silicon-containing resin layer 11 preferably has a thickness equal to or more than the root-mean-square (RMS) roughness of the surface 9m of the insulation layer 9. In general, the RMS roughness of the surface 9m of the insulation layer 9 due to irregularities in a main surface of the semiconductor substrate 1 is substantially equivalent to the RMS roughness of the irregularities in the main surface of the semiconductor substrate 1 and is, for example, about 0.3 μm.

The upper limit of the thickness of the non-silicon-containing resin layer 11 may be, for example, about 1 μm. The pattern width (refer to FIG. 2B) for forming the diffraction grating 7g (refer to FIG. 8A) is very small: about 100 nm. When the non-silicon-containing resin layer 11 has a thickness of 1 μm or more, it is difficult to sufficiently provide an etching gas into etching grooves in the non-silicon-containing resin layer 11 in the "step of etching non-silicon-containing resin layer" described below. Thus, the non-silicon-containing resin layer 11 is preferably made to have a thickness of 1 μm or less (see FIGS. 5A and 5B). In this case, an etching-depth distribution in the non-silicon-containing resin layer 11 in a plane parallel to a main surface of the semiconductor substrate 1 can be sufficiently made uniform. Accordingly, no portion of the non-silicon-containing resin layer 11 without being etched is left. The non-silicon-containing resin layer 11 is uniformly etched. Then, the surface 9m of the insulation layer 9 are uniformly exposed. As a result, when the non-silicon-containing resin layer 11 has a thickness of 1 μm or less, an etching-depth distribution in the insulation layer 9 in a plane parallel to a main surface of the semiconductor substrate 1 can also be made uniform in the subsequent "step of etching insulation layer".

To enhance adhesion between the insulation layer 9 and the non-silicon-containing resin layer 11, an adhesion layer may be formed between the insulation layer 9 and the non-silicon-containing resin layer 11. Such an adhesion layer may be formed of, for example, a novolac resin. Such an adhesion layer may have a thickness of for example, 50 nm or more and 80 nm or less.

Step of Forming Pattern in Non-Silicon-Containing Resin Layer

Figure 2B:
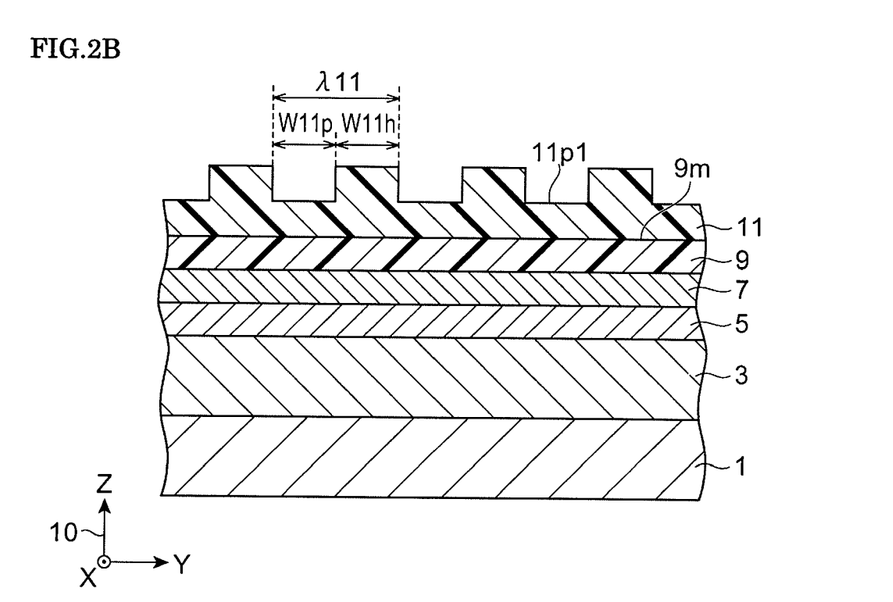

Referring to FIG. 2B, the non-silicon-containing resin layer 11 is then patterned to thereby form a periodic structure pattern 11p1 (corresponding to the periodic structure of the diffraction grating 7g to be formed in a subsequent step (refer to FIG. 8A)) in the surface of the non-silicon-containing resin layer 11. The periodic structure pattern 11p1 is the first pattern of the embodiment. The non-silicon-containing resin layer 11 may be patterned by, for example, a photolithography method or a nanoimprint lithography method. The periodic structure pattern 11p1 in the embodiment is a line-and-space pattern for forming the diffraction grating 7g in the diffraction-grating layer 7.

This line-and-space pattern is constituted by line sections extending along X axis and space sections extending along X axis. The line sections and the space sections are alternately periodically disposed along Y axis. A width W11h of the line sections in the Y-axis direction is substantially equal to a width W7h of recesses of the diffraction grating 7g to be formed (refer to FIG. 8A) and is, for example, 100 to 120 nm. Similarly, a width W11p of the space sections in the Y-axis direction is substantially equal to a width W7p of projections of the diffraction grating 7g to be formed (refer to FIG. 8A) and is, for example, 100 to 120 nm. A period λ11 of the line-and-space pattern is substantially equal to a period λ7 of the diffraction grating 7g to be formed (refer to FIG. 8A).

Step of Forming Silicon-Containing Resin Layer

Figure 3A:
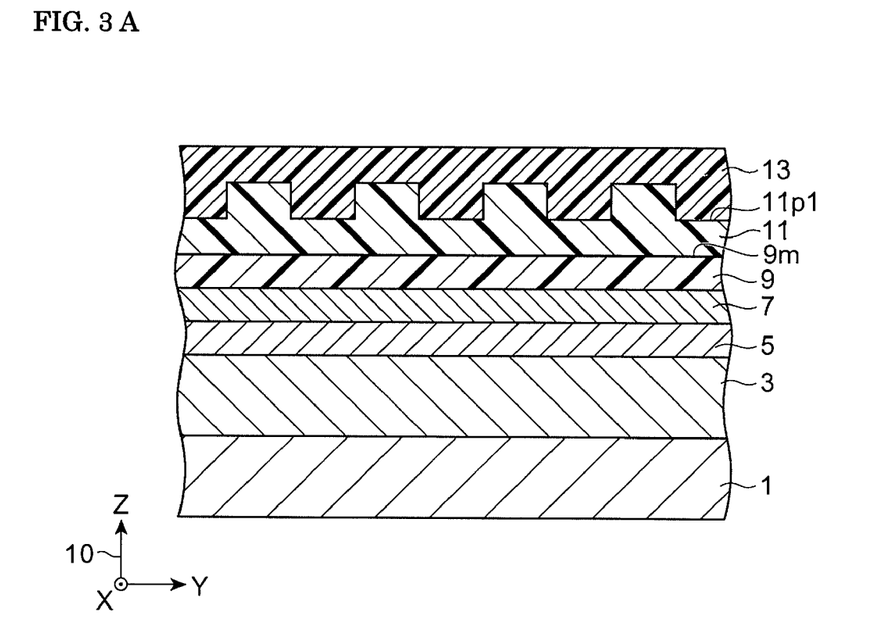
FIGS. 3A and 3B are schematic sectional views illustrating a method for producing a distributed feedback laser diode according to an embodiment.

Referring to FIG. 3A, a silicon-containing resin layer 13 is then formed on the non-silicon-containing resin layer 11 so that the silicon-containing resin layer 13 covers the surface of the non-silicon-containing resin layer 11. The silicon-containing resin layer 13 can be formed by, for example, applying a silicon-containing resin to the non-silicon-containing resin layer 11 by spin coating. Examples of such a silicon-containing resin for forming the silicon-containing resin layer 13 include organic silicon compounds.

Step of Etching Silicon-Containing Resin Layer: First Etching Step

Figure 3B:
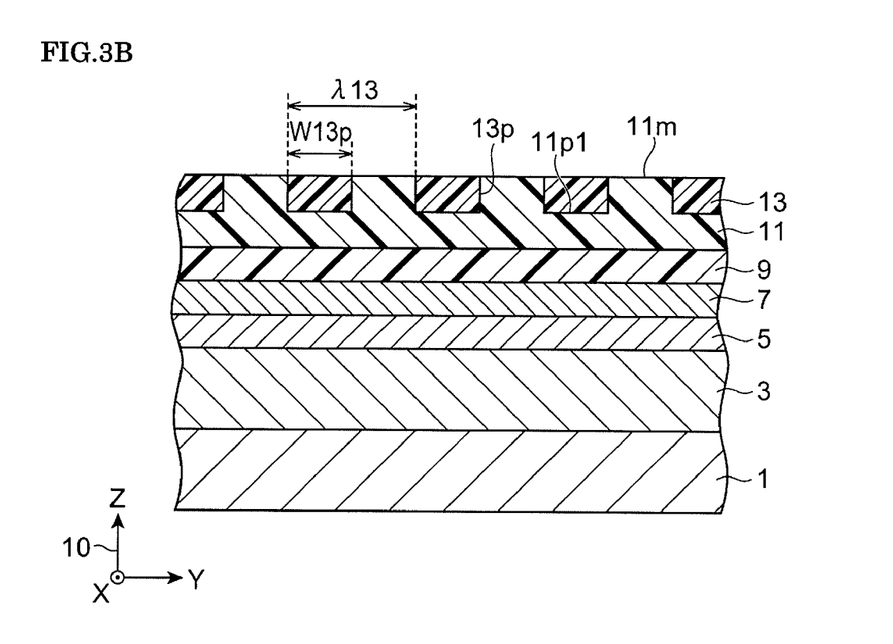

Referring to FIG. 3B, the silicon-containing resin layer 13 is then etched until a surface 11m of projections of the periodic structure pattern 11p1 of the non-silicon-containing resin layer 11 is exposed (etch-back step). The silicon-containing resin layer 13 in the etch-back step can be etched by, for example, a dry etching process such as a reactive ion etching (RIE) method.

As a result, the silicon-containing resin layer 13 is made to have, in recesses of the periodic structure pattern 11p1 of the non-silicon-containing resin layer 11, a periodic structure pattern 13p corresponding to the periodic structure of the diffraction grating 7g. The periodic structure pattern 13p is the second pattern of the embodiment. The periodic structure pattern 13p of the embodiment is the reverse pattern to the first pattern. The periodic structure pattern 13p is constituted by a plurality of line sections that are periodically arranged adjacent to one another along Y axis and extend along X axis. Thus, the silicon-containing resin layer 13 masks portions of the surface of the non-silicon-containing resin layer 11.

A width W13p of the line sections of the silicon-containing resin layer 13 in the Y-axis direction is substantially equal to the width W7p of projections of the diffraction grating 7g to be formed (refer to FIG. 8A) and is, for example, 100 to 120 nm. A period λ13 of the line sections of the silicon-containing resin layer 13 is substantially equal to the period λ7 of the diffraction grating 7g to be formed (refer to FIG. 8A).

The silicon-containing resin layer 13 is etched in the first etching step by, for example, a reactive ion etching method employing a gas mixture containing $CF_4$ gas and $O_2$ gas. An example of a reactive ion etching apparatus used in the first etching step and other subsequent steps in which etching by a reactive ion etching method is performed will be described.

Figure 4:
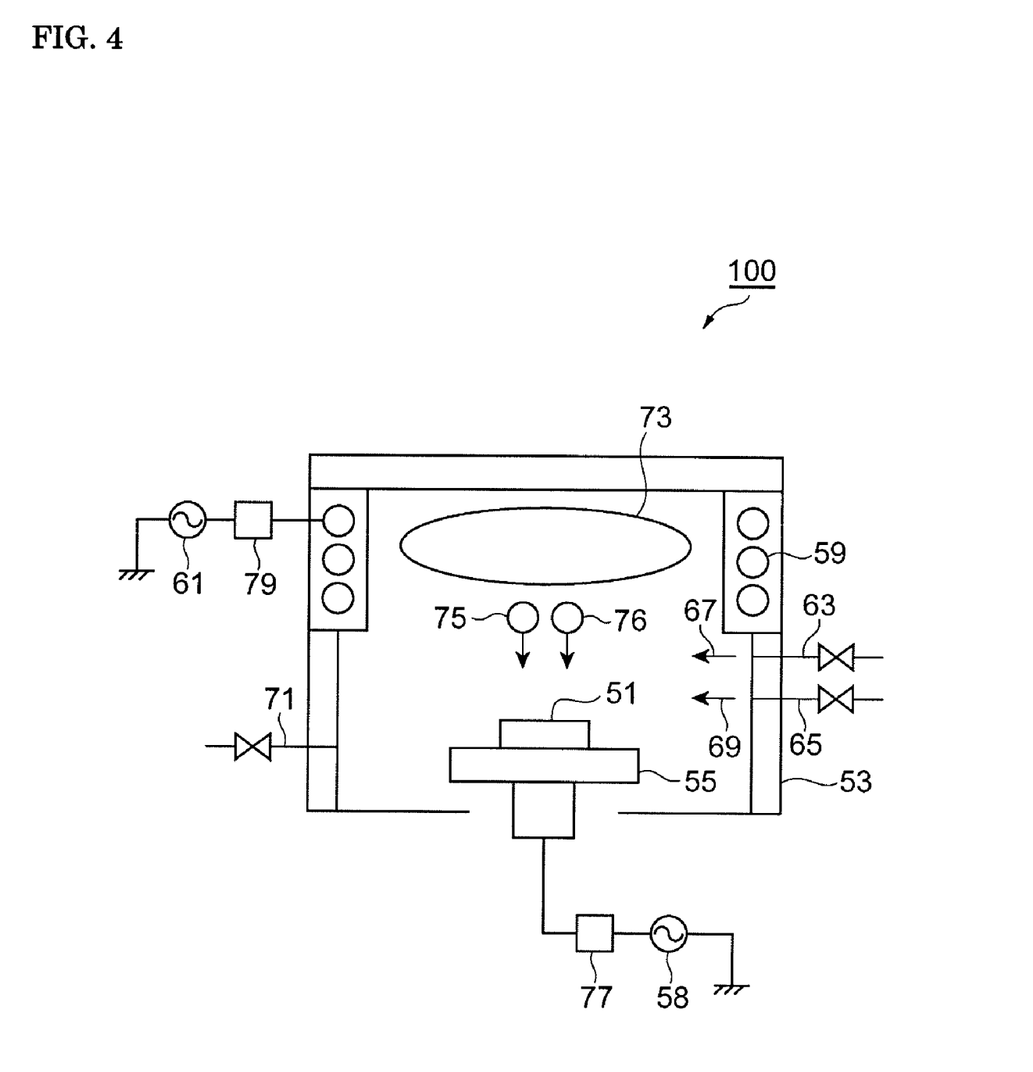
FIG. 4 is a schematic sectional view illustrating the configuration of a reactive ion etching apparatus.

FIG. 4 is a schematic sectional view illustrating the configuration of a reactive ion etching apparatus. A reactive ion etching apparatus used in the embodiment is an inductive coupled plasma reactive ion etching (ICP RIE) apparatus 100. The ICP RIE apparatus 100 includes a vacuum chamber 53. In the vacuum chamber 53, a lower electrode 55 is disposed. A sample 51 is placed on the lower electrode 55. The lower electrode 55 is equipped with a cooling mechanism and controls the temperature of the sample 51 being etched to be a predetermined temperature. A radio frequency (RF) power supply 58 is connected to the lower electrode 55 through an impedance matching circuit 77. The RF power supply 58 applies RF power as bias power to the lower electrode 55. A direct bias electric field is generated in the vacuum chamber 53 in accordance with the bias power. An induction coil 59 is wound around the vacuum chamber 53. An inductive coupled plasma (ICP) power supply 61 is connected to the induction coil 59 through an impedance matching circuit 79. The ICP power supply 61 applies RF power so that the induction coil 59 generates inductive coupled plasma (ICP).

The vacuum chamber 53 is equipped with two gas feed pipes 63 and 65 through which an etching gas is fed into the vacuum chamber 53 and an exhaust pipe 71 through which the etching gas is exhausted. An etching gas is fed through the two gas feed pipes 63 and 65 into the vacuum chamber 53. For example, when reactive ion etching is performed with a gas mixture containing $CF_4$ gas and $O_2$ gas as in "step of etching silicon-containing resin layer", $CF_4$ gas (tetrafluoromethane gas) 67 is fed through the gas feed pipe 63 into the vacuum chamber 53 while $O_2$ gas (oxygen gas) 69 is fed through the gas feed pipe 65 into the vacuum chamber 53. The exhaust pipe 71 is connected to a vacuum pump so that the internal pressure of the vacuum chamber 53 can be kept at a predetermined pressure.

When the sample 51 is etched, while bias power is applied to the lower electrode 55 and ICP power is applied to the induction coil 59, gases (for example, $CF_4$ gas 67 and $O_2$ gas 69) serving as components of an etching gas are fed into the vacuum chamber 53. As a result, the induction coil 59 turns the etching gas into inductive coupled plasma (ICP) 73. Ions 75 in the thus-formed ICP 73 are accelerated by a direct bias electric field generated in the vacuum chamber 53 in accordance with the bias power and are made to impinge on the sample 51. Radicals 76 in the ICP 73 diffuse to reach the sample 51. Thus, the sample 51 is etched by the ions 75 and the radicals 76. Based on such etching mechanisms, etching with the ions 75 mainly contributes to anisotropic etching of the sample 51 while etching with the radicals 76 mainly contributes to isotropic etching of the sample 51. Accordingly, isotropic etching or anisotropic etching can be selected by changing the magnitude of bias power in an ICP reactive ion etching method. In the embodiment, to reduce damage to the sample 51 caused by etching, the bias power is set so that isotropic etching by the radicals 76 is mainly performed.

Step of Etching Non-Silicon-Containing Resin Layer: Second Etching Step

Figure 5A:
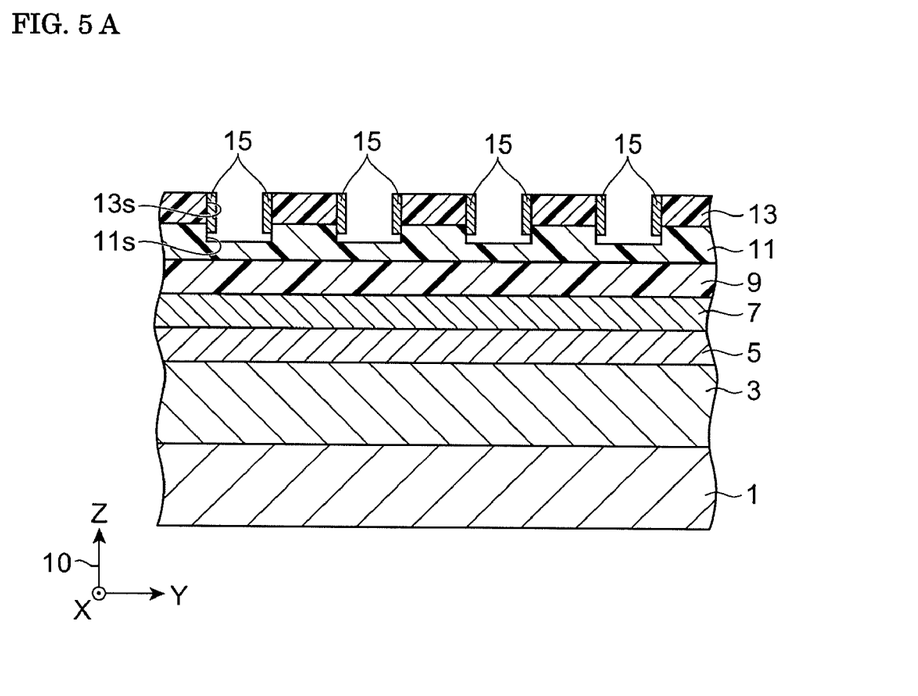
FIGS. 5A and 5B are schematic sectional views illustrating a method for producing a distributed feedback laser diode according to an embodiment.
Figure 5B:
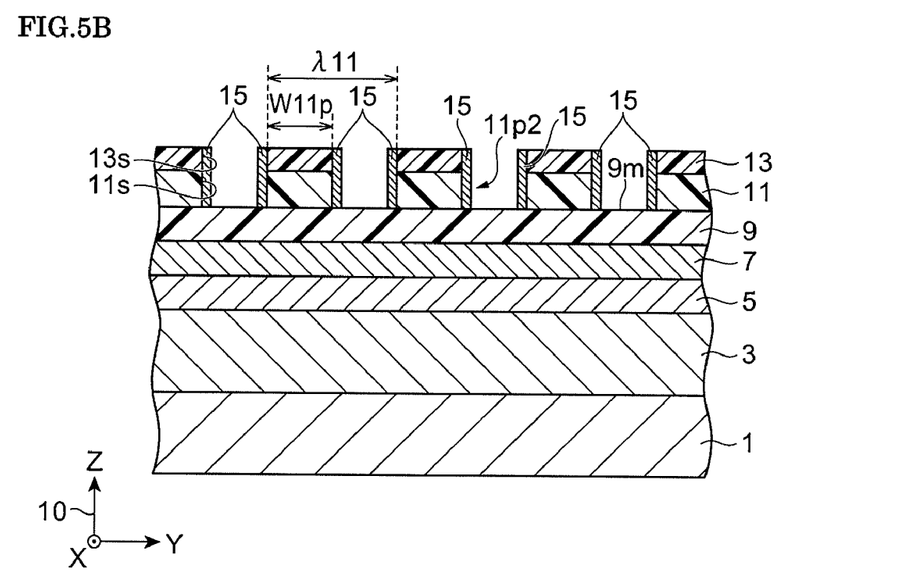

Referring to FIGS. 5A and 5B, the non-silicon-containing resin layer 11 is etched through the silicon-containing resin layer 13 serving as a mask to thereby expose portions of the surface 9m of the insulation layer 9 (breakthrough etching step). The silicon-containing resin layer 13 has the periodic structure pattern 13p which is the second pattern in the embodiment. The non-silicon-containing resin layer 11 also has the second pattern by etching through the silicon-containing resin layer 13.

FIG. 5A illustrates a state in which the non-silicon-containing resin layer 11 is being etched. FIG. 5B illustrates a state in which the non-silicon-containing resin layer 11 has been etched.

The non-silicon-containing resin layer 11 is etched in the "step of etching non-silicon-containing resin layer (second etching step)" by a reactive ion etching method while the silicon-containing resin layer 13 and the non-silicon-containing resin layer 11 are maintained at a temperature equal to or less than the freezing point of $SiF_4$. In this etching, a gas mixture containing $CF_4$ gas and $O_2$ gas is used as an etching gas. The freezing point of $SiF_4$ is, for example, about −95.5° C. (lower than room temperature) at 1,013 hPa. To maintain the silicon-containing resin layer 13 and the non-silicon-containing resin layer 11 at a temperature equal to or less than the freezing point of $SiF_4$, the cooling mechanism of the lower electrode 55 can be used. This cooling mechanism includes, for example, an electrostatic chuck configured to suck a circumferential portion of the back surface of the semiconductor substrate 1 to the lower electrode 55 such that a space is formed between the lower electrode 55 and a central portion of the back surface of the semiconductor substrate 1; and a feeder configured to feed a coolant such as liquid helium to the space.

When the non-silicon-containing resin layer 11 is etched, the surface of the silicon-containing resin layer 13 is also etched. Thus, silicon in the silicon-containing resin layer 13 reacts with $CF_4$ and $O_2$ in the etching gas in a manner represented by the following chemical reaction formula to produce $SiF_4$.

$$Si+CF_4+O_2 \rightarrow CO_2+SiF_4$$

The non-silicon-containing resin layer 11 is etched while the silicon-containing resin layer 13 and the non-silicon-containing resin layer 11 are maintained at a temperature equal to or less than the freezing point of $SiF_4$. Accordingly, the thus-produced $SiF_4$ freezes on side walls 11s of the non-silicon-containing resin layer 11 and on side walls 13s of the silicon-containing resin layer 13 (the side walls 11s and the side walls 13s are formed as a result of etching the non-silicon-containing resin layer 11). As a result, protective layers 15 containing $SiF_4$ are formed on the side walls 11s of the non-silicon-containing resin layer 11 and on the side walls 13s of the silicon-containing resin layer 13. As illustrated in FIGS. 5A and 5B, as the etching of the non-silicon-containing resin layer 11 proceeds, the formation of the protective layers 15 proceeds in the negative Z-axis direction on the side walls 11s of the non-silicon-containing resin layer 11 and on the side walls 13s of the silicon-containing resin layer 13.

As illustrated in FIG. 5B, the non-silicon-containing resin layer 11 is etched until portions of the surface 9m of the insulation layer 9 are exposed.

When an adhesion layer is formed between the insulation layer 9 and the non-silicon-containing resin layer 11, the adhesion layer is also etched in the breakthrough etching step. Then, the surface 9m of the insulation layer 9 are exposed.

As a result, the non-silicon-containing resin layer 11 is patterned so as to have a periodic structure pattern 11p2 corresponding to the periodic structure of the diffraction grating 7g to be formed. As described above, The periodic structure pattern 11p2 is the second pattern of the embodiment. Specifically, the periodic structure pattern 11p2 is constituted by a plurality of line sections that are periodically arranged adjacent to one another along Y axis and extend along X axis. The width W11p of the line sections of the periodic structure pattern 11p2 in the Y-axis direction is substantially equal to the width W7p of projections of the diffraction grating 7g to be formed (refer to FIG. 8A) and is, for example, 100 to 120 nm. The period λ11 of the periodic structure pattern 11p2 is substantially equal to the period λ7 of the diffraction grating 7g to be formed (refer to FIG. 8A).

When the non-silicon-containing resin layer 11 is etched, the internal pressure of the vacuum chamber 53 of the ICP RIE apparatus 100 is controlled within the range of, for example, 1 Pa or more and 5 Pa or less. The ICP power applied to the induction coil 59 is, for example, 200 W or more and 300 W or less. The flow rate of the $CF_4$ gas 67 fed through the gas feed pipe 63 into the vacuum chamber 53 is, for example, 50 sccm or more and 100 sccm or less. The flow rate of the $O_2$ gas 69 fed through the gas feed pipe 65 into the vacuum chamber 53 is preferably 5 sccm or more and 10 sccm or less.

The non-silicon-containing resin layer 11 is preferably etched in an environment having a pressure in the range of 1 Pa or more and 5 Pa or less. When the pressure is 1 Pa or more, plasma discharge can be sufficiently stabilized. When the pressure is 5 Pa or less, mean free path of ions and radicals in plasma during etching is sufficiently long and hence the side walls 11s (formed by etching) of the non-silicon-containing resin layer 11 are less likely to be etched. In summary, when the non-silicon-containing resin layer 11 is etched at a pressure in the range of 1 Pa or more and 5 Pa or less, plasma discharge is sufficiently stabilized and side etching of the non-silicon-containing resin layer 11 is suppressed.

When the non-silicon-containing resin layer 11 is etched, the mixing ratio of the $CF_4$ gas 67 to the $O_2$ gas 69 in the etching gas is preferably in the range of 5:1 to 20:1 (partial pressure ratio). When the mixing ratio of the $CF_4$ gas 67 to the $O_2$ gas 69 is less than 5:1 (that is, the proportion of the $O_2$ gas 69 in the etching gas is excessively higher), $O_2$ reacts with silicon (Si) in the silicon-containing resin to produce $SiO_2$, which may hamper etching of the non-silicon-containing resin layer 11. Accordingly, the mixing ratio of the $CF_4$ gas 67 to the $O_2$ gas 69 is preferably more than or equal to 5:1 to reduce the amount of $SiO_2$ produced by the reaction between $O_2$ and Si in the silicon-containing resin. When the mixing ratio of the $CF_4$ gas 67 to the $O_2$ gas 69 is more than 20:1, excessive deposition of $SiF_4$ on the bottom of etching grooves is formed in the non-silicon-containing resin layer 11 during etching of the non-silicon-containing resin layer 11. Therefore, the mixing ratio of the $CF_4$ gas 67 to the $O_2$ gas 69 is preferably less than or equal to 20:1 to suppress the excessive deposition of $SiF_4$ on the bottom of etching grooves.

As illustrated in FIGS. 5A and 5B, when the non-silicon-containing resin layer 11 is etched in the "step of etching non-silicon-containing resin layer (second etching step)", the silicon-containing resin layer 13 is also etched and thinned.

Step of Etching Insulation Layer: Third Etching Step

Figure 6A:
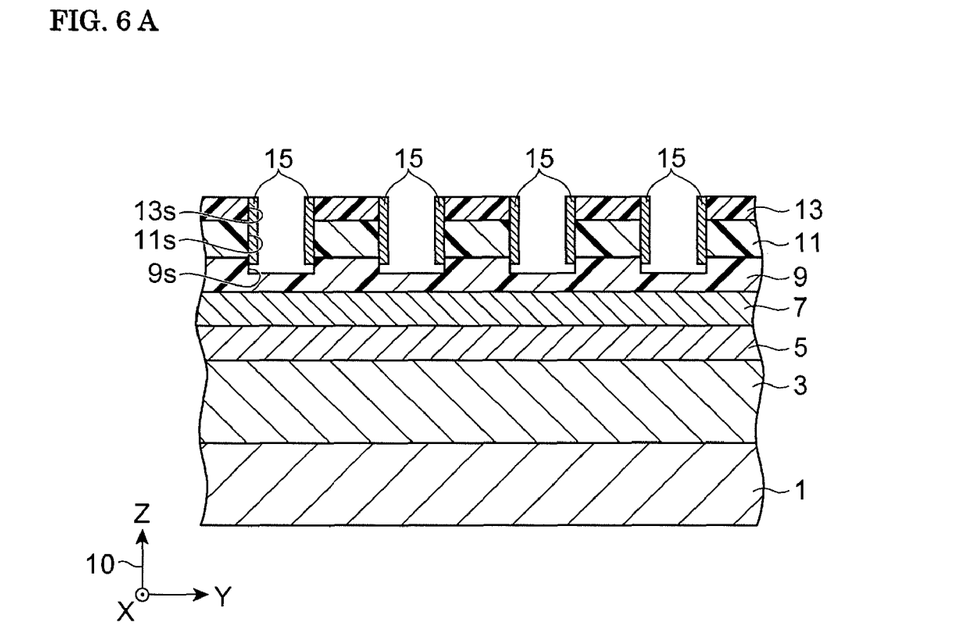
FIGS. 6A and 6B are schematic sectional views illustrating a method for producing a distributed feedback laser diode according to an embodiment.
Figure 6B:
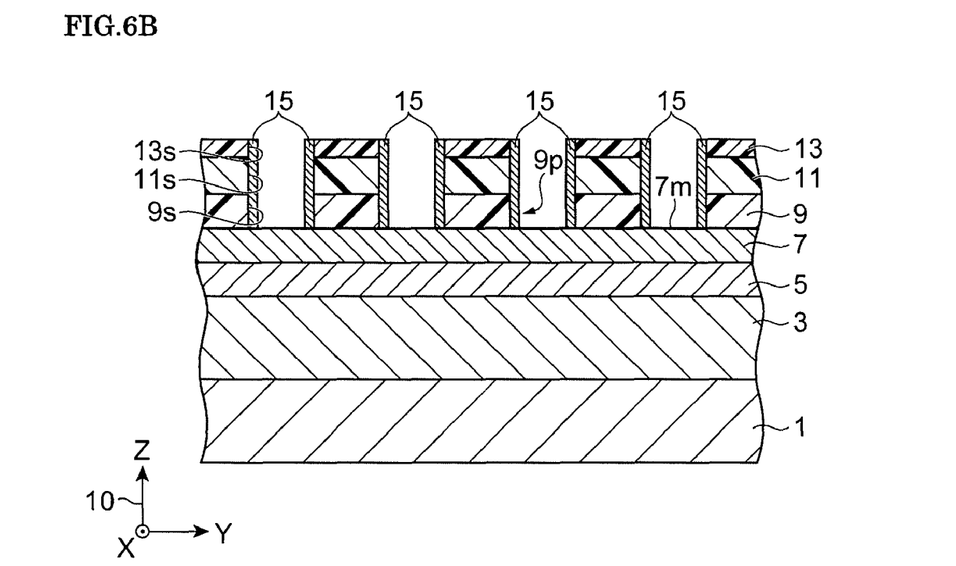

Referring to FIGS. 6A and 6B, the insulation layer 9 is then etched through the patterned non-silicon-containing resin layer 11 and the patterned silicon-containing resin layer 13 serve as a mask (third etching step). The patterned non-silicon-containing resin layer 11 and the patterned silicon-containing resin layer 13 have the second pattern in the embodiment.

FIG. 6A illustrates a state in which the insulation layer 9 is being etched. FIG. 6B illustrates a state in which the insulation layer 9 has been etched.

The insulation layer 9 in the third etching step is etched until the surface 7m of the diffraction-grating layer 7 is exposed. The embodiment will be described that includes steps of transferring the diffraction-grating pattern (the second pattern) of the patterned non-silicon-containing resin layer 11 and the patterned silicon-containing resin layer 13 onto the insulation layer 9, and etching the semiconductor layer through the insulation layer 9 serving as a mask to thereby form the diffraction-grating pattern in the semiconductor layer. In the embodiment, the insulation layer 9 has the second pattern. Alternatively, without the formation of the insulation layer 9, the diffraction-grating pattern may be formed in the semiconductor layer through the patterned non-silicon-containing resin layer 11 and the patterned silicon-containing resin layer 13 serving as a mask.

When the insulation layer 9 is formed on the semiconductor layer, contamination of the surface of the semiconductor layer can be suppressed during the formation of a micropattern with the non-silicon-containing resin layer 11 and the silicon-containing resin layer 13. In addition, the surface of the semiconductor layer can be protected from damage caused by reactive ion etching.

In the embodiment, the insulation layer 9 is etched by a reactive ion etching method while the silicon-containing resin layer 13, the non-silicon-containing resin layer 11, and the insulation layer 9 are maintained at a temperature equal to or less than the freezing point of $SiF_4$. In this etching, a gas mixture containing $CF_4$ gas and $O_2$ gas can be used as an etching gas.

When the insulation layer 9 is etched, the surface of the silicon-containing resin layer 13 is also etched. Accordingly, $SiF_4$ is also produced in the "step of etching insulation layer (third etching step)" and freezes on side walls 9s of the insulation layer 9 having the second pattern. Thus, the formation of the protective layers 15 proceeds in the negative Z-axis direction on the side walls 9s of the insulation layer 9. That is, the formation of the protective layers 15 proceeds from the side walls 11s of the non-silicon-containing resin layer 11 to the side walls 9s of the insulation layer 9.

In the "step of etching insulation layer (third etching step)", the insulation layer 9 is patterned so as to have a periodic structure pattern 9p corresponding to the periodic structure of the diffraction grating 7g to be formed. Specifically, the periodic structure pattern 9p is constituted by a plurality of line sections that are periodically arranged adjacent to one another along Y axis and extend along X axis. A width W9p of the line sections of the periodic structure pattern 9p in the Y-axis direction is substantially equal to the width W7p of projections of the diffraction grating 7g to be formed (refer to FIG. 8A) and is, for example, 100 to 120 nm. A period λ9 of the periodic structure pattern 9p is substantially equal to the period λ7 of the diffraction grating 7g to be formed (refer to FIG. 8A). After the "step of etching insulation layer", the silicon-containing resin layer 13 may remain or not (the silicon-containing resin layer 13 may be completely removed by etching).

When the insulation layer 9 is etched, the internal pressure of the vacuum chamber 53 of the ICP RIE apparatus 100 is in the range of, for example, 1 Pa or more and 5 Pa or less. The ICP power applied to the induction coil 59 is, for example, 200 W or more and 300 W or less. The flow rate of the $CF_4$ gas 67 fed through the gas feed pipe 63 into the vacuum chamber 53 is, for example, 50 sccm or more and 100 sccm or less (refer to FIG. 4).

Temperature Increase Step

Figure 7A:
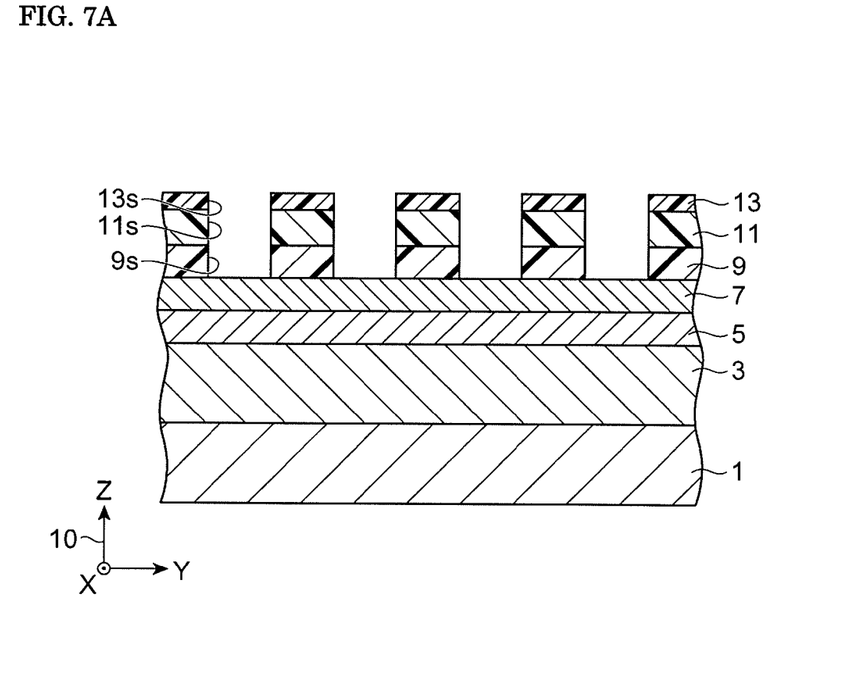
FIGS. 7A and 7B are schematic sectional views illustrating a method for producing a distributed feedback laser diode according to an embodiment.

Referring to FIG. 7A, the temperature of the silicon-containing resin layer 13, the non-silicon-containing resin layer 11, and the insulation layer 9 is increased to a temperature higher than the freezing point of $SiF_4$. This target temperature is, for example, a temperature equal to or higher than room temperature. As a result, the protective layers 15 are vaporized and removed. The temperature of the silicon-containing resin layer 13, the non-silicon-containing resin layer 11, and the insulation layer 9 can be increased to a temperature higher than the freezing point of $SiF_4$ by, for example, stopping the cooling of the lower electrode 55 (refer to FIG. 4) with the cooling mechanism; or heating the lower electrode 55 (refer to FIG. 4) by using a heating mechanism, for example, a heater loaded to the electrode 55. In this case, the temperature can be increased within the ICP RIE apparatus without taking out the substrate from the chamber.

Figure 7B:
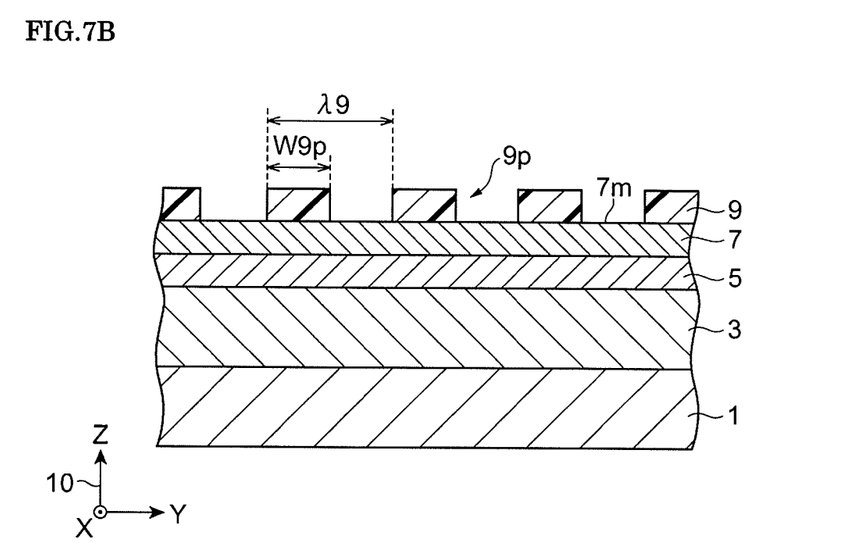

Step of Removing Silicon-Containing Resin Layer and Non-Silicon-Containing Resin Layer Referring to FIG. 7B, the silicon-containing resin layer 13 and the non-silicon-containing resin layer 11 are subsequently removed. The silicon-containing resin layer 13 and/ or the non-silicon-containing resin layer 11 can be removed by, for example, after the "step of etching insulation layer (third etching step)", a dry etching process such as a reactive ion etching method. The silicon-containing resin layer 13 is etched by an etching process in which an etch rate for the silicon-containing resin layer 13 is higher than etch rates for the diffraction-grating layer 7 and the non-silicon-containing resin layer 11. The silicon-containing resin layer 13 is etched by, for example, a reactive ion etching method employing an etching gas containing $CF_4$ gas. The non-silicon-containing resin layer 11 is etched by an etching process in which an etch rate for the non-silicon-containing resin layer 11 is higher than etch rates for the diffraction-grating layer 7 and the insulation layer 9. The non-silicon-containing resin layer 11 can be etched by, for example, a reactive ion etching method employing an etching gas containing $O_2$ gas.

Diffraction-Grating Forming Step

Figure 8A:
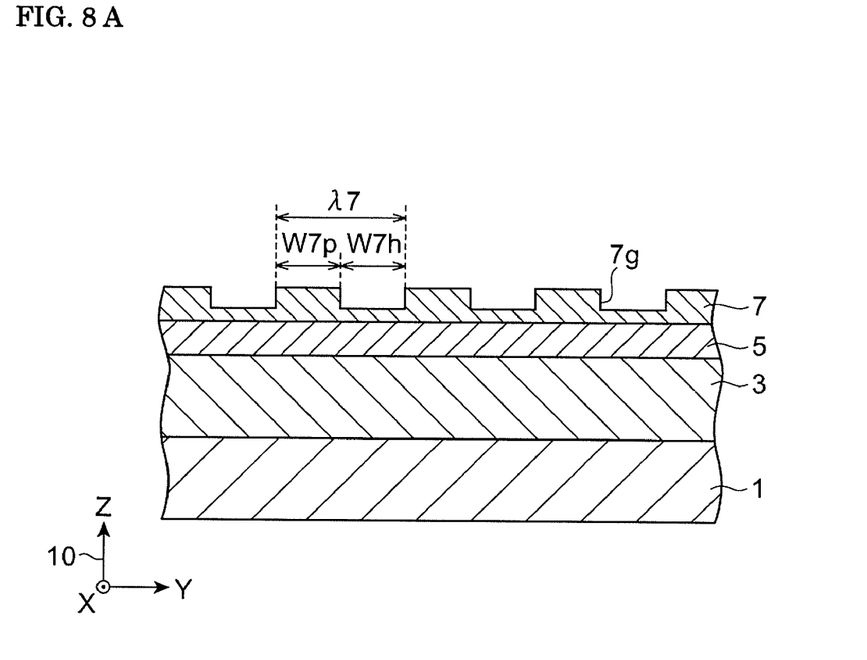
FIGS. 8A and 8B are schematic sectional views illustrating a method for producing a distributed feedback laser diode according to an embodiment.

Referring to FIG. 8A, the diffraction-grating layer 7 is then etched to the midpoint of its thickness through the patterned insulation layer 9 serving as a mask and the insulation layer 9 is subsequently removed. The diffraction-grating layer 7 can be etched by, for example, a reactive ion etching method employing an etching gas containing $CH_4$ gas and $H_2$ gas. The insulation layer 9 can be removed by, for example, a wet etching process employing an etchant such as hydrofluoric acid.

As a result, the diffraction grating 7g constituted by the line-and-space pattern is formed in the diffraction-grating layer 7. Specifically, the diffraction grating 7g is constituted by line sections extending along X axis and space sections extending along X axis. The line sections and the space sections are alternately periodically disposed along Y axis. The width W7p of the line sections in the Y-axis direction is, for example, 100 to 120 nm. The period λ7 of the line-and-space pattern of the diffraction grating 7g is, for example, 200 to 240 nm.

Figure 8B:
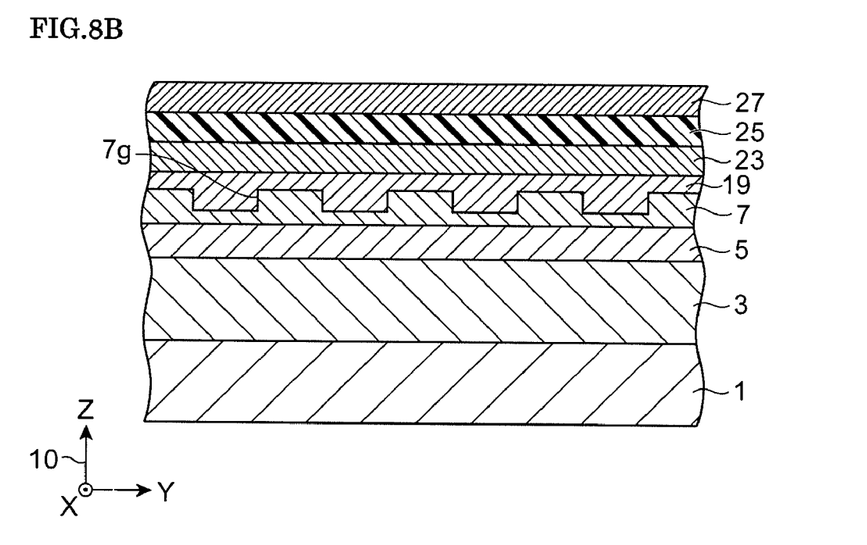

Referring to FIG. 8B, an upper cladding layer 19, a contact layer 23, an insulation layer 25, and a resist layer 27 are subsequently formed in this order on the diffraction-grating layer 7.

The upper cladding layer 19 and the contact layer 23 are formed by, for example, a metal-organic vapor phase epitaxy (MOVPE) growth method. The upper cladding layer 19 is formed so as to fill and cover the diffraction grating 7g. The upper cladding layer 19 is composed of, for example, a group III-V compound semiconductor having the second conductivity, such as InP. When the second conductivity is p-type, a p-type impurity such as zinc (Zn) may be used. The contact layer 23 is composed of, for example, a group III-V compound semiconductor having the second conductivity, such as InGaAs. The insulation layer 25 is formed by, for example, a plasma CVD method. The insulation layer 25 is composed of, for example, silicon oxide ($SiO_2$) or silicon nitride (SiN). The resist layer 27 is formed on the insulation layer 25 by, for example, a spin coating method.

Figure 9A:
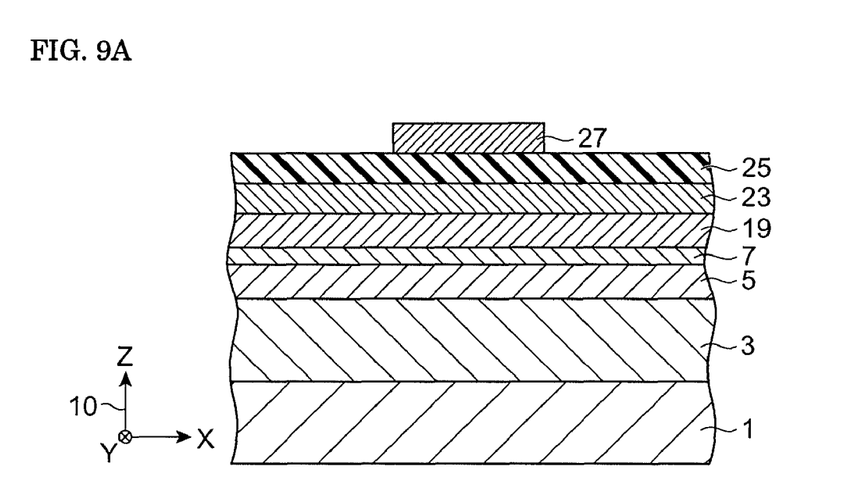
FIGS. 9A, 9B, and 9C are schematic sectional views illustrating a method for producing a distributed feedback laser diode according to an embodiment.
Figure 9B:
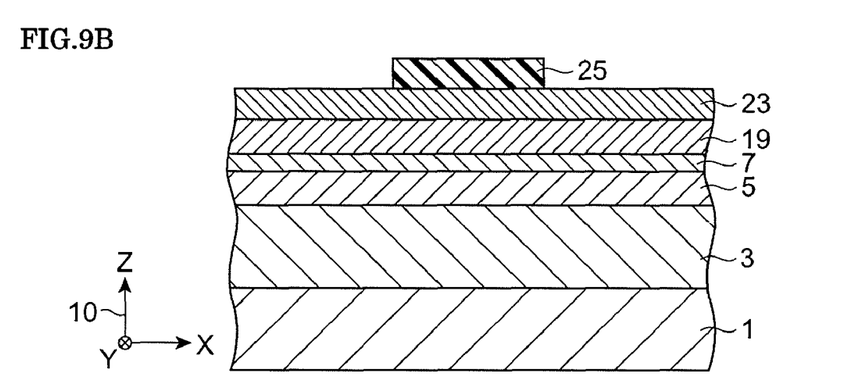

Referring to FIG. 9A, the resist layer 27 is then patterned into portions extending along Y axis by a standard photolithography process. Referring to FIG. 9B, the insulation layer 25 is then patterned into portions extending along Y axis through the patterned resist layer 27 serving as a mask and the resist layer 27 is removed.

Figure 9C:
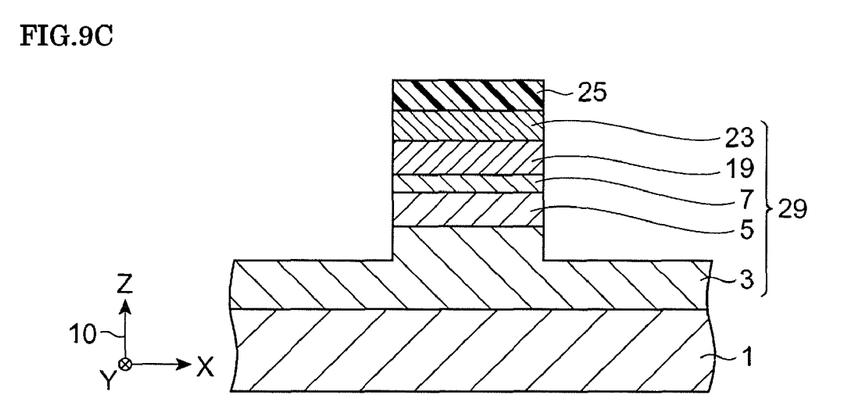

Referring to FIG. 9C, etching is then performed from the surface of the contact layer 23 to the midpoint of the thickness of the lower cladding layer 3 through the patterned insulation layer 25 serving as a mask. As a result, semiconductor mesa structures 29 are formed.

Figure 10A:
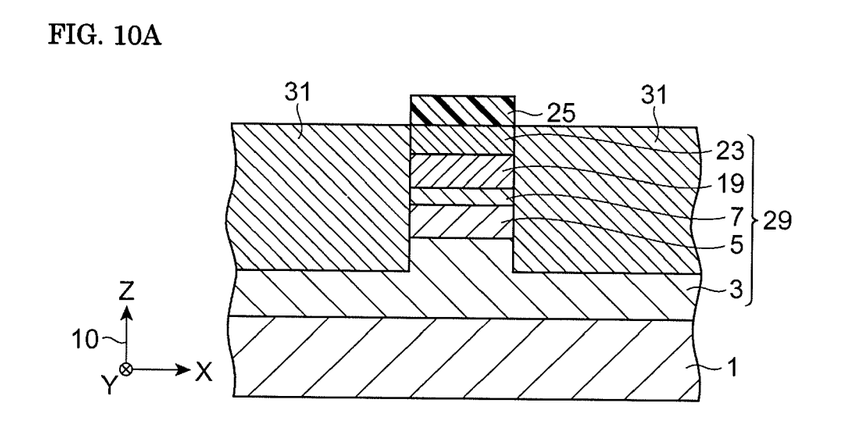
FIGS. 10A, 10B, and 10C are schematic sectional views illustrating a method for producing a distributed feedback laser diode according to an embodiment.

Referring to FIG. 10A, a group III-V compound semiconductor region 31 is then selectively grown through the patterned insulation layer 25 serving as a mask, for example, by a metal-organic vapor phase epitaxy (MOVPE) growth method. As a result, the group III-V compound semiconductor region 31 is formed on the lateral sides of each semiconductor mesa structure 29 and on the lower cladding layer 3. The group III-V compound semiconductor region 31 may include, for example, an InP layer having the second conductivity and another InP layer having the first conductivity on the second-conductivity InP layer. Alternatively, the group III-V compound semiconductor region 31 may be constituted by a semi-insulating InP layer doped with Fe.

Figure 10B:
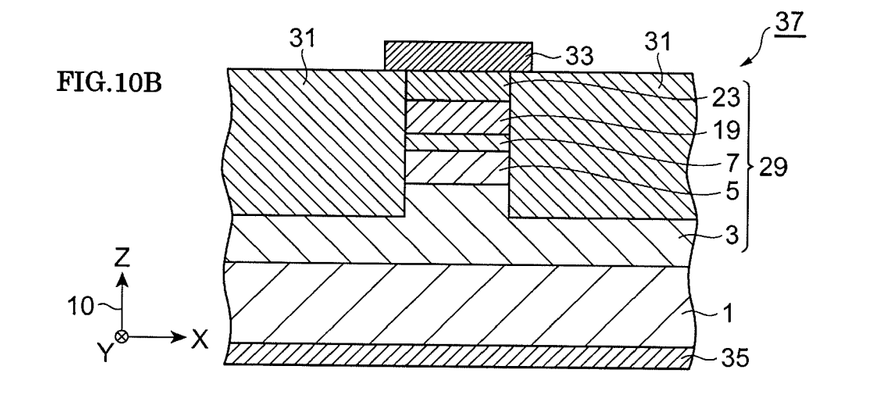

Referring to FIG. 10B, the insulation layer 25 is then removed; an upper electrode 33 is formed on the contact layer 23; and a lower electrode 35 is formed on the back surface of the semiconductor substrate 1. Thus, a substrate product 37 is formed.

Figure 10C:
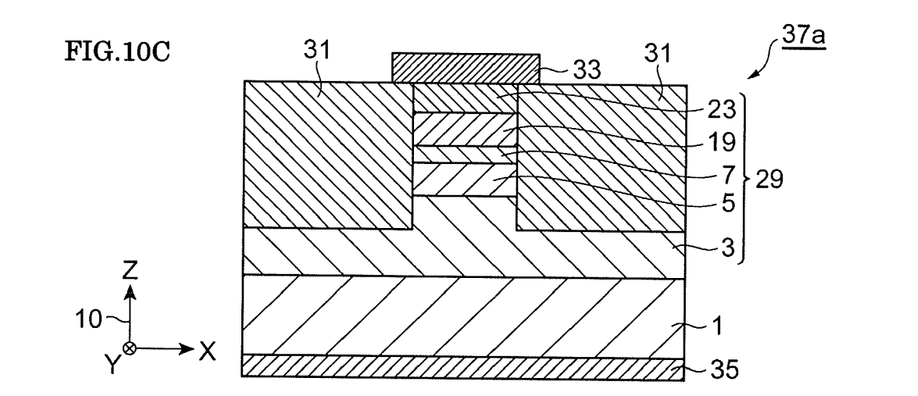

Referring to FIG. 10C, the substrate product 37 is then divided into chips to provide DFB laser diodes 37a.

In the method for producing the DFB laser diodes 37a according to the above-described embodiment, in the "step of etching non-silicon-containing resin layer (second etching step)" after the "step of etching silicon-containing resin layer (first etching step)", the non-silicon-containing resin layer 11 is selectively etched through the silicon-containing resin layer 13 serving as a mask. At this time, the non-silicon-containing resin layer 11 is etched while the silicon-containing resin layer 13 and the non-silicon-containing resin layer 11 are maintained at a temperature equal to or less than the freezing point of $SiF_4$ (refer to FIGS. 5A and 5B). Accordingly, the protective layers 15 containing frozen $SiF_4$ are formed on the side walls 13s of the silicon-containing resin layer 13 and on the side walls 11s of the non-silicon-containing resin layer 11 (the side walls 13s and the side walls 11s are formed as a result of etching the non-silicon-containing resin layer 11) (refer to FIGS. 5A and 5B).

The presence of the protective layers 15 suppresses etching of the side walls 13s of the silicon-containing resin layer 13 and the side walls 11s of the non-silicon-containing resin layer 11 in the "step of etching non-silicon-containing resin layer (second etching step)". That is, side etching of the silicon-containing resin layer 13 and the non-silicon-containing resin layer 11 is suppressed. As a result, variation in the patterned structure (structure of the periodic structure pattern 11p2) of the non-silicon-containing resin layer 11 due to side etching is suppressed. Thus, variation in the patterned structure (structure of the periodic structure pattern 9p, refer to FIG. 6B) of the insulation layer 9 after the subsequent "step of etching insulation layer (third etching step)" is also suppressed. When the diffraction-grating layer 7 (semiconductor layer) is etched through this insulation layer 9 serving as a mask, variation in the structure of the diffraction grating 7g is also suppressed (refer to FIG. 8A).

As described above, in the "step of etching non-silicon-containing resin layer (second etching step)", the presence of the protective layers 15 suppresses side etching in the side walls 13s of the silicon-containing resin layer 13 and the side walls 11s of the non-silicon-containing resin layer 11. Accordingly, in the "step of etching silicon-containing resin layer (first etching step)" and the "step of etching non-silicon-containing resin layer (second etching step)", a reactive ion etching method may be employed with an etching gas for etching the silicon-containing resin layer 13 and the non-silicon-containing resin layer 11, that is, a gas mixture containing $CF_4$ gas and $O_2$ gas (refer to FIGS. 3A, 3B, 5A, and 5B). In this case, the etching gas does not need to be exhausted from the vacuum chamber 53 of the ICP RIE apparatus 100 after the first etching step (refer to FIG. 4). Furthermore, the same ICP RIE apparatus 100 can be used in the steps of etching the silicon-containing resin layer (first etching step and selectively etching the non-silicon-containing resin layer (second etching step). Accordingly, the productivity is enhanced.

Therefore, the method for producing the DFB laser diodes 37a according to the embodiment provides a method for producing the diffraction grating 7g with a bilayer resist (the silicon-containing resin layer 13 and the non-silicon-containing resin layer 11). In addition, the method for producing the DFB laser diodes 37a according to the embodiment has high productivity, and can suppress variation in the structure of the diffraction grating 7g.

As described above, the method for producing a semiconductor optical device according to the embodiment further includes, prior to the "step of forming diffraction grating", the temperature increase step of increasing the temperature of the silicon-containing resin layer 13 and the non-silicon-containing resin layer 11 to a temperature higher than the freezing point of $SiF_4$ (refer to FIG. 7A). As a result, the protective layers 15 do not affect the structure of the diffraction grating 7g in the "step of forming diffraction grating" (refer to FIG. 8A). Accordingly, variation in the structure of the diffraction grating 7g is suppressed.

In the method for producing the DFB laser diodes 37a according to the above-described embodiment, in the "step of etching insulation layer (third etching step)", the insulation layer 9 is etched by a reactive ion etching method employing a gas mixture containing $CF_4$ gas and $O_2$ gas while the silicon-containing resin layer 13, the non-silicon-containing resin layer 11, and the insulation layer 9 are maintained at a temperature equal to or less than the freezing point of $SiF_4$ (refer to FIGS. 6A and 6B). The temperature increase step is performed after the step of etching the insulation layer. In the temperature increase step, the temperature of the silicon-containing resin layer 13, the non-silicon-containing resin layer 11, and the insulation layer 9 is increased to a temperature higher than the freezing point of $SiF_4$ (refer to FIG. 7A).

As a result, in the "step of etching insulation layer (third etching step)", the state in which the protective layers 15 are formed on the side walls 13s of the silicon-containing resin layer 13 and on the side walls 11s of the non-silicon-containing resin layer 11 is maintained. The protective layers 15 containing frozen $SiF_4$ are also formed on the side walls 9s of the insulation layer 9 (the side walls 9s are formed as a result of etching the insulation layer 9) (refer to FIGS. 6A and 6B). Thus, etching of the side walls 9s of the insulation layer 9 is suppressed in the step of etching the insulation layer. That is, side etching of the insulation layer 9 is suppressed. Thus, variation in the patterned structure (structure of the periodic structure pattern 9p, refer to FIG. 6B) of the insulation layer 9 due to side etching is suppressed. Accordingly, variation in the structure of the diffraction grating 7g is suppressed.

In the method for producing the DFB laser diodes 37a according to the above-described embodiment, in the "step of etching non-silicon-containing resin layer (second etching step)", the non-silicon-containing resin layer 11 is preferably etched by ICP RIE at a bias power between 50 W and 100 W (refer to FIGS. 5A and 5B). When the non-silicon-containing resin layer 11 is etched by ICP RIE at a bias power of 50 W or more, the formation of the protective layer 15 having excessively large thickness is suppressed on the side walls 13s of the silicon-containing resin layer 13 and on the side walls 11s of the non-silicon-containing resin layer 11. In addition, the non-silicon-containing resin layer 11 is etched without hampering of etching due to the large thickness of the protective layers 15. When the non-silicon-containing resin layer 11 is etched by ICP RIE at a bias power of 100 W or less, the protective layer 15 having a thickness to suppress side etching of the silicon-containing resin layer 13 and the non-silicon-containing resin layer 11 can be formed.

In the method for producing the DFB laser diodes 37a according to the above-described embodiment, the silicon-containing resin layer 13 preferably has a silicon content of 20 atom % or more and 30 atom % or less. When the silicon content is made 20 atom % or more, the protective layers 15 can be formed so as to have a thickness sufficiently large to suppress side etching of the silicon-containing resin layer 13 and the non-silicon-containing resin layer 11 in the "step of etching non-silicon-containing resin layer (second etching step)" and the "step of etching insulation layer (third etching step)". When the silicon content is made 30 atom % or less, the formation of the protective layers 15 having excessively large thickness is suppressed in the second etching step and the third etching step. In addition, hampering of etching of the layers (that are supposed to be etched) due to the large thickness of the protective layers 15 can be suppressed.

The present invention is not restricted to the above-described embodiments and encompasses various modifications.

For example, in the above-described embodiment, the ICP RIE apparatus 100 is used to etch the layers in the "step of etching silicon-containing resin layer (first etching step)", the "step of etching non-silicon-containing resin layer (second etching step)", and the "step of etching insulation layer (third etching step)". Alternatively, a part of or the entirety of these etching steps may be performed with another reactive ion etching apparatus such as a capacitive coupled plasma-RIE (CCP-RIE) apparatus or an electron cyclotron resonance-RIE (ECR-RIE) apparatus.

In the above-described embodiment, in the "step of etching silicon-containing resin layer (first etching step)", the silicon-containing resin layer 13 is etched without making the temperature of the silicon-containing resin layer 13 and the non-silicon-containing resin layer 11 be equal to or less than the freezing point of $SiF_4$ (refer to FIGS. 3A and 3B). Alternatively, in the first etching step, the silicon-containing resin layer 13 may be etched by a reactive ion etching method employing a gas mixture containing $CF_4$ gas and $O_2$ gas as an etching gas while the silicon-containing resin layer 13 and the non-silicon-containing resin layer 11 are maintained at a temperature equal to or less than the freezing point of $SiF_4$.

In this case, since the silicon-containing resin layer 13 and the non-silicon-containing resin layer 11 are maintained at a temperature equal to or less than the freezing point of $SiF_4$ also in the first etching step, etching of the silicon-containing resin layer 13 in the first etching step and etching of the non-silicon-containing resin layer 11 in the second etching step can be continuously performed (refer to FIGS. 3B, 5A, and 5B). As a result, a higher productivity can be achieved.

In the above-described embodiment, the temperature increase step is performed after the "step of etching insulation layer (third etching step)" (refer to FIG. 7A). Alternatively, the temperature increase step may be performed between the second etching step and the third etching step. In this case, since the protective layers 15 are not formed in the third etching step (refer to FIGS. 6A and 6B), the silicon-containing resin layer 13 may be completely removed by etching in the second etching step (refer to FIG. 5B). When the silicon-containing resin layer 13 is completely removed by etching in the second etching step, the insulation layer 9 is etched through the non-silicon-containing resin layer 11 only serving as a mask in the third etching step (refer to FIGS. 6A and 6B).

In the above-described embodiment, the diffraction grating 7g is formed in the diffraction-grating layer 7 that is beyond the active layer 5 with respect to the semiconductor substrate 1 (refer to FIG. 8B). Alternatively, the diffraction grating 7g may be formed in a semiconductor layer that is closer to the semiconductor substrate 1 than the active layer 5.

In the above-described embodiment, the method for producing DFB laser diodes including diffraction gratings, in particular, the method for producing semiconductor optical devices including one-dimensional diffraction-grating patterns as micropatterns is described. However, the present invention is also applicable to, for example, production of laser diodes having photonic crystals including two-dimensional diffraction-grating patterns as micropatterns. The micropatterns are not restricted to diffraction-grating patterns having periodic projections and recesses and the present invention is applicable as long as a pattern includes a projection and a recess.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A method for producing a semiconductor optical device, comprising the steps of:
    forming a semiconductor layer on a substrate;
    forming a non-silicon-containing resin layer on the semiconductor layer;
    forming a first pattern having a projection and a recess in the non-silicon-containing resin layer;
    forming a silicon-containing resin layer on the non-silicon-containing resin layer so as to cover the projection and the recess;
    etching the silicon-containing resin layer until a surface of the projection of the non-silicon-containing resin layer is exposed, the silicon-containing resin layer being left in the recess of the non-silicon-containing resin layer, the silicon-containing resin layer having a second pattern reverse to the first pattern;
    selectively etching the non-silicon-containing resin layer through the patterned silicon-containing resin layer by a reactive ion etching method employing a gas mixture containing $CF_4$ gas and $O_2$ gas, the non-silicon-containing resin layer having the second pattern; and
    etching the semiconductor layer through the patterned non-silicon-containing resin layer,
    wherein, in the step of selectively etching the non-silicon-containing resin layer, a side wall of the second pattern in the silicon-containing resin layer and the non-silicon-containing resin layer is formed, the silicon-containing resin layer and the non-silicon-containing resin layer are maintained at a temperature equal to or less than a freezing point of $SiF_4$, and a protective layer containing $SiF_4$ is formed on the side wall of the second pattern in the silicon-containing resin layer and the non-silicon-containing resin layer.

2. The method according to claim 1, further comprising:
    after the step of selectively etching the non-silicon-containing resin layer, a step of increasing a temperature of the silicon-containing resin layer and the non-silicon-containing resin layer to a temperature higher than the freezing point of $SiF_4$.

3. The method according to claim 1, wherein, in the step of etching the silicon-containing resin layer, the silicon-containing resin layer is etched by a reactive ion etching method employing a gas mixture containing $CF_4$ gas and $O_2$ gas while the silicon-containing resin layer and the non-silicon-containing resin layer are maintained at a temperature equal to or less than the freezing point of $SiF_4$.

4. The method according to claim 1, further comprising the steps of:
    forming an insulation layer on the semiconductor layer after the step of forming the semiconductor layer; and
    etching the insulation layer through the patterned non-silicon-containing resin layer to form a patterned insulation layer having the second pattern after the step of selectively etching the non-silicon-containing resin layer,
    wherein, in the step of selectively etching the non-silicon-containing resin layer, the non-silicon-containing resin layer is etched until a portion of a surface of the insulation layer is exposed,
    in the step of etching the insulation layer, the insulation layer is etched until a portion of a surface of the semiconductor layer is exposed, and
    in the step of etching the semiconductor layer, the semiconductor layer is etched through the patterned insulation layer.

5. The method according to claim 4, wherein, in the step of etching the insulation layer, the insulation layer is etched by a reactive ion etching method employing a gas mixture containing $CF_4$ gas and $O_2$ gas while the silicon-containing resin layer, the non-silicon-containing resin layer, and the insulation layer are maintained at a temperature equal to or less than the freezing point of $SiF_4$; and
    in the step of etching the insulation layer, a protective layer containing $SiF_4$ is formed on a side wall of the second pattern of the insulation layer.

6. The method according to claim 5, further comprising:
    after the step of etching the insulation layer, a step of increasing a temperature of the silicon-containing resin layer, the non-silicon-containing resin layer, and the insulation layer to a temperature higher than the freezing point of $SiF_4$.

7. The method according to claim 1, wherein the first pattern is a diffraction grating pattern having periodic projections and recesses.

8. The method according to claim 1, wherein, in the step of selectively etching the non-silicon-containing resin layer, the non-silicon-containing resin layer is etched by inductive coupled plasma reactive ion etching at a bias power between 50 W and 100 W.

* * * * *